United States Patent [19]

Kozuka et al.

[11] Patent Number: 5,381,372
[45] Date of Patent: Jan. 10, 1995

[54] SEMICONDUCTOR MEMORY DEVICE

[75] Inventors: Eiji Kozuka; Naokazu Miyawaki, both of Yokohama, Japan

[73] Assignee: Kabushiki Kaisha Toshiba, Kawasaki, Japan

[21] Appl. No.: 56,919

[22] Filed: May 5, 1993

[30] Foreign Application Priority Data

May 6, 1992 [JP] Japan .................. 4-113756

[51] Int. Cl.$^6$ .............................................. G11C 29/00
[52] U.S. Cl. .................. 365/201; 365/230.03
[58] Field of Search ............ 365/201, 230.03, 63, 365/230.01, 200

[56] References Cited

U.S. PATENT DOCUMENTS

| | | | |
|---|---|---|---|
| 4,744,061 | 5/1988 | Takomae | 365/230.03 |
| 5,202,853 | 4/1993 | Choi | 365/201 |
| 5,243,570 | 9/1993 | Saruwatari | 365/201 |

*Primary Examiner*—Eugene R. LaRoche
*Assistant Examiner*—A. Zarabian
*Attorney, Agent, or Firm*—Foley & Lardner

[57] ABSTRACT

A semiconductor memory device has a plurality of memory cell arrays; input and output sections each provided so as to correspond to each of the memory cell arrays; and an allocating section provided between the memory cell arrays and the input and output sections, for allocating one of the memory cell arrays to one of the input output sections in ordinary mode, and a plurality of the memory cell arrays to one of the input and output sections in test mode. In the operation test mode, since only a part of the input and output sections are used, it is possible to decrease the number of chips connected to the I/O pins (whose maximum number is limited) of the tester so as to be testable simultaneously, so that the number of chips whose operation tests can be implemented simultaneously can be increased, thus reducing the time required for the operation test of the memory device as a whole.

7 Claims, 8 Drawing Sheets

SEMICONDUCTOR MEMORY DEVICE

BACKGROUND OF THE INVENTION

1. Field of the Invention

The present invention relates to a semiconductor memory device provided with a test circuit for implementing an operation test.

2. Description of the Prior Art

A conventional semiconductor memory device will be described by way of an example of a DRAM (Dynamic Random Access Memory) with a memory capacity of 4M bits.

Figure 1:
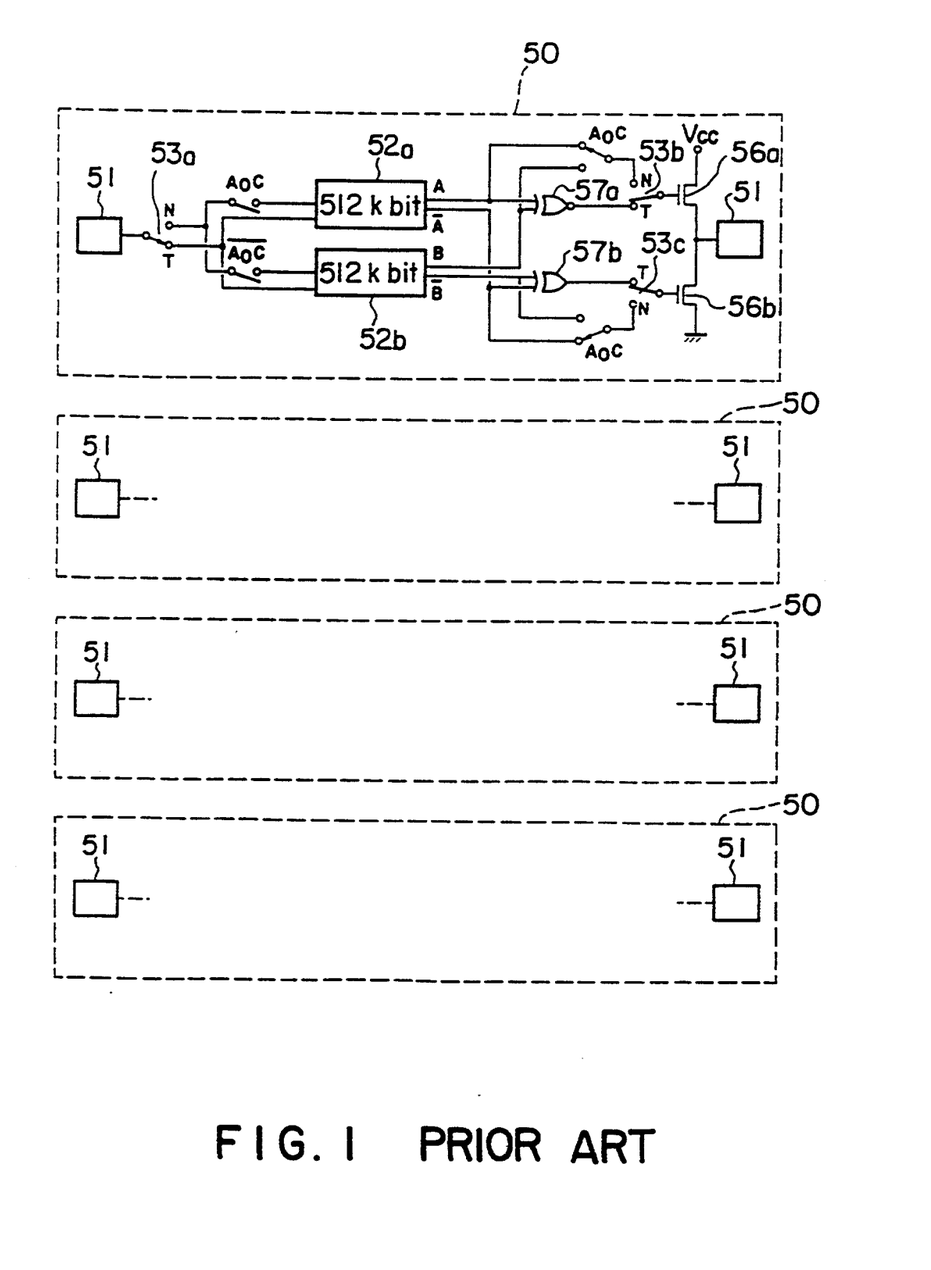
FIG. 1 is a schematic block diagram showing an example of prior art semiconductor memory devices.

FIG. 1 is a block diagram showing an example of 4-bit DRAMs. In the figure, a single input and output section 51 and two memory cell arrays 52a and 52b are allocated to each of four blocks 50. Further, in FIG. 1, the input and output section 51 for inputting a test signal and outputting a test result signal is shown at two different positions to facilitate understanding of the functions thereof.

Each of the memory cell arrays 52a and 52b can store information data of 512 kbits. Therefore, each block 50 has a memory capacity of 1M bits, and the device has a memory capacity of 4M bits in total.

To implement an operation test of the semiconductor memory device as described above, three switches 53a, 53b and 53c are first set to Test (T in FIG. 1) to input test signals through the input and output section 51, so that the same signal is written simultaneously in a single memory cell of the memory cell array 52a and a single memory cell of the memory cell array 52b. Therefore, when these two test signals are read simultaneously, an output of a logic circuit 57a (an inversion value of exclusive OR) is at a "high" level (referred to as H level hereinafter), and an output of a logic circuit 57b (an non-inversion value of exclusive OR) is at a "low" level (referred to as L level, hereinafter), as far as the semiconductor memory device is operative normally. Accordingly, a MOS transistor 56a is turned on and a MOS transistor 56b is turned off, so that a signal of Vcc volt (the H level) is outputted from the input and output section 51. On the other hand, in case the semiconductor memory device is not operative normally, since the output signal of the input and output section 51 is at the L level, it is possible to discriminate the memory device as a defective device.

In the 4-bit DRAM as described above, since the memory cell array is divided into two in a single block 50, in the operation test the test signal is written in and read from the two memory cells simultaneously for each bit. Here, since the memory capacity of each memory cell array 52a or 52b is 512 kbits, the signal writing and reading operation is repeated 512×1024 times, in order to complete the overall operation test of a single DRAM.

Figure 2:
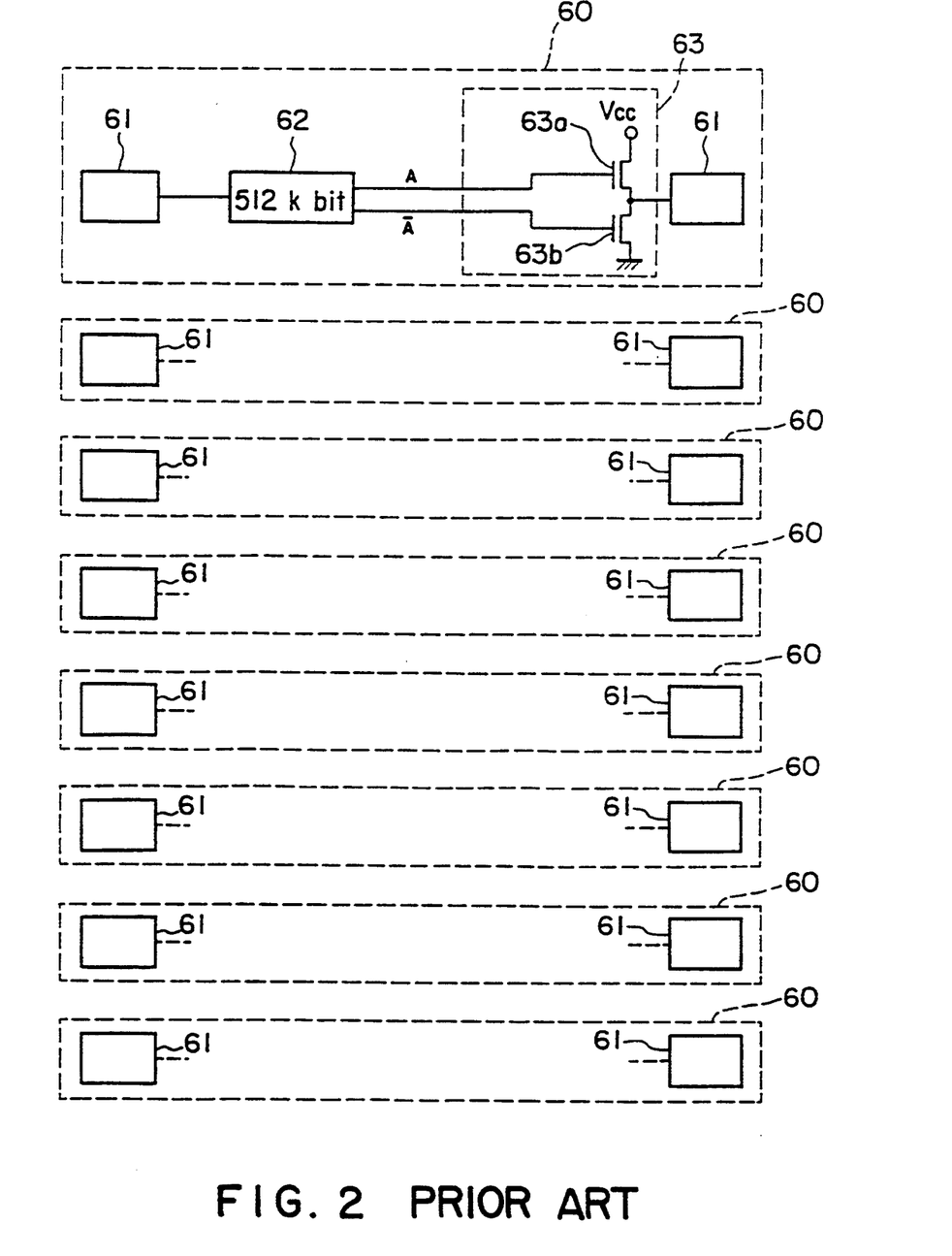
FIG. 2 is a schematic block diagram showing another example of prior art semiconductor memory devices.

FIG. 2 is a block diagram showing a similar example of 8-bit DRAMs with a memory capacity of 4M bits in total. In the DRAM shown in FIG. 2, a single memory cell array 62 is allocated to each of 8 blocks 60.

To implement an operation test, test signals are inputted to each memory cell array 62 with a memory capacity of 512 kbits through each of the 8 input and output sections 61, and then read therefrom. In this case, when the level of the read test signal is at "1", an output A is at an H level, and an output /A is at an L level, so that a MOS transistor 63a is turned on and a MOS transistor 63b is turned off in a read circuit 63. Therefore, a signal of Vcc volt (i.e., H level) is outputted from the input and output section 61. In contrast with this, when the signal read from the memory cell array 62 is at "0", a signal of 0 volt (i.e., L level) is outputted from the input and output section 61.

Further, a prior art 16-bit DRAM is almost the same as this 8-bit DRAM in device configuration. That is, the DRAM includes 16 blocks each having a single memory cell array and a single input and output section, without having any test circuit. Further, in the case of the memory capacity of 4M bits, the memory capacity of a single memory cell array is 256 kbits.

As described above, in the prior art multi-bit (8- or 16-bit) DRAM, being different from the case of the above-mentioned 4-bit DRAM, the test signal is written in and read from only a single memory cell simultaneously for each bit.

In the 8-bit DRAM shown in FIG. 2, since the memory capacity of the respective memory cell array 62 is 512 kbits, the signal writing and reading operation must be repeated 512×1024 times in order to implement the overall operation test of a single DRAM.

Further, as already explained, in the case of the 16-bit DRAM whose memory cell capacity of a single memory cell array is 256 kbits, the signal writing and reading operation must be repeated 256×1024 times in order to implement the overall operation test of a single DRAM.

As described above, in the case of the multi-bit DRAMs of the same memory capacity, the repeated number of the test signal writing and reading operation required for the overall operation test of a single DRAM decreases with increasing number of bits.

In the actual operation test, however, since the number of the drivers and operators is limited, the number of chips which can be tested simultaneously by a single test system decreases, on the contrary, with increasing number of bits, with the result that it takes a long time to implement the operation test of the DRAMs.

The reason thereof will be described in more detail by taking the case of a test system whose number of drivers and comparators is 40, respectively and whose maximum number of simultaneous measurement is 8. That is, this test system is provided with 40 drivers for writing the test signals in the memory cells and 40 comparators for discriminating whether the read test signals are correct or not (in other words, 40 bits can be measured simultaneously), and further the maximum number of chips testable simultaneously is 8.

Figure 3:
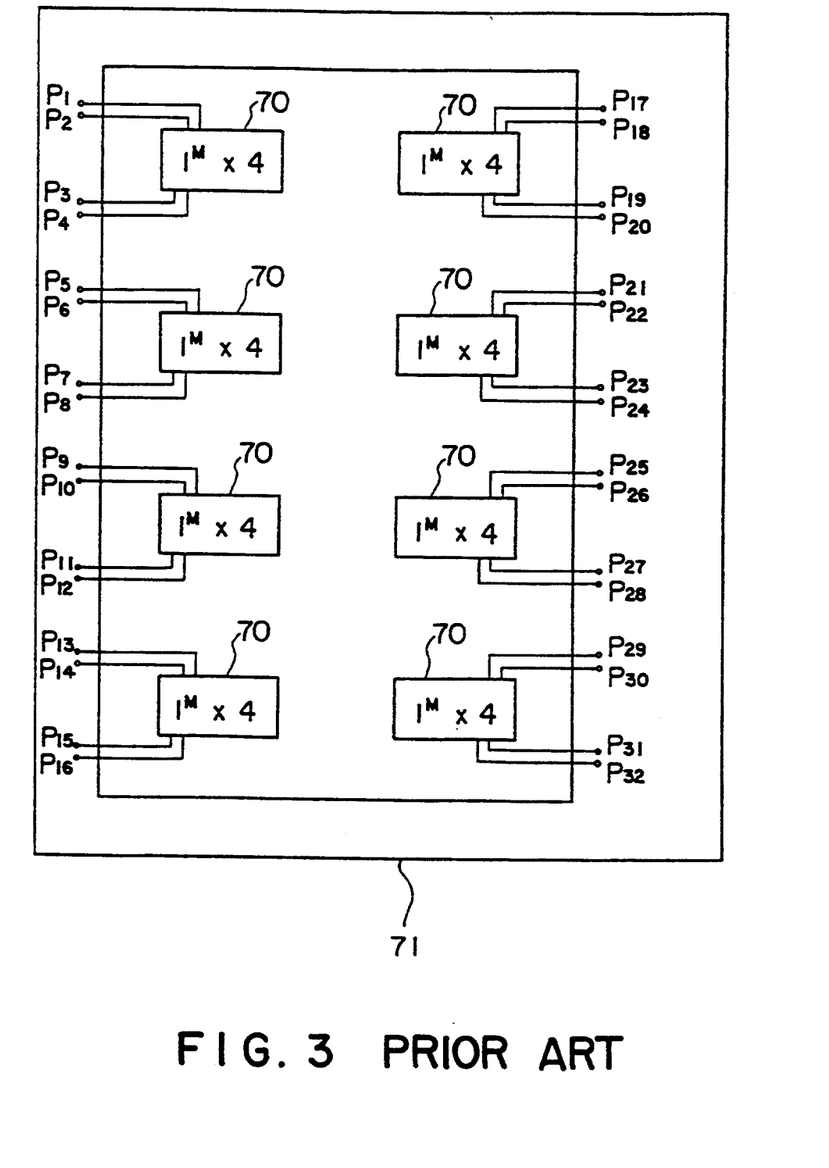
FIG. 3 is a conceptual diagram showing the status where the prior art semiconductor memory devices shown in FIG. 1 are set to a test system.

In the case of the operation test of the 4-bit DRAM, as shown in FIG. 3, the test system 71 can implement the operation test of 8 DRAMs 70 simultaneously (i.e., the same number as the maximum number of the simultaneous measurement). Further, in FIG. 3, P1 to P32 denote terminals (i.e., I/O pins) for connecting the input and output sections of the DRAMs to the test system 71, respectively.

Here, the test time T(4) required to implement the operation test of 100 units of 4-bit DRAMs 70 can be estimated by way of example as follows:

$$T(4) = (100/8) \{k + (512 \times 1024 \cdot t)\}$$
$$= 12.5(k + 2^{19} t)$$

where k denotes a setup time required to implement a single operation test; and t denotes the time required to write and read a single test signal. Further, the signal writing and reading operation is repeated 512×1024 times for each operation test.

Here, if K=12.5 k, and T=12.5×2$^{19}$t, $$T(4) = K + T$$

Figure 4:
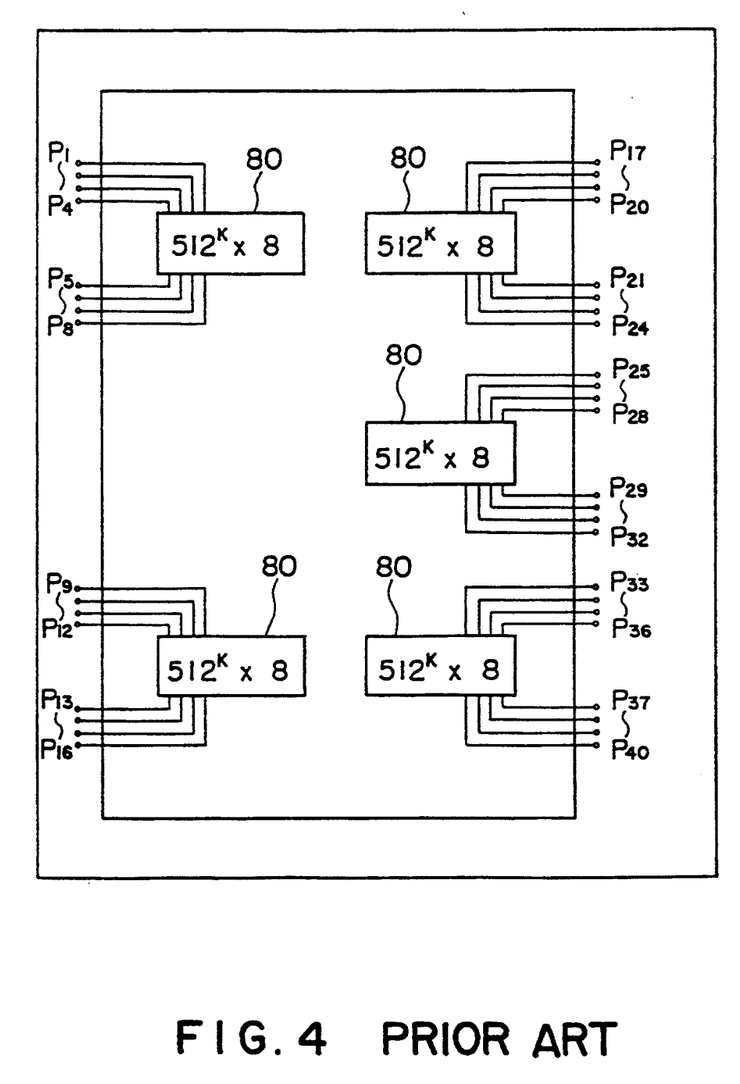
FIG. 4 is a conceptual diagram showing the status where the prior art semiconductor memory devices shown in FIG. 2 are set to a test system.

Further, as shown in FIG. 4, in the case of the operation test of the 8-bit DRAM 80, since the number of the drivers and the comparators is 40, the number of chips which can be tested simultaneously by the test system 71 is 5. Further, in FIG. 4, P1 to P40 denote the terminal for connecting the input and output sections of the DRAMs to the test system, respectively.

Here, the test time T(8) required to implement the operation test of 100 units of 8-bit DRAMs 80 can be estimated by way of example as follows:

$$\begin{aligned} T(8) &= (100/5)\{k + (512 \times 1024 \cdot t)\} \\ &= 20(k + 2^{19} t) \end{aligned}$$

Accordingly, $$T(8) = 1.6 \, (K+T)$$

Further, in the case of the operation test of the 16-bit DRAMs (not shown), the number of chips which can be tested simultaneously is 2.

Here, the test time T(16) required to implement the operation test of 100 units of 16-bit DRAMs can be estimated as follows:

$$\begin{aligned} T(16) &= (100/2)\{k + (256 \times 1024 \cdot t)\} \\ &= 50(k + 2^{18} t) \end{aligned}$$

Accordingly, $$T(16) = 4.0 \, (K + 0.5 \, T)$$

That is, the test time of the 8-bit DRAMs 80 is about 1.6 times longer than that of the 4-bit DRAMs 70. Here, the time required to write and read data in and from a single cell is about 300 ns at the most; and on the other hand, several tens of seconds are required as the setup time when the ambient temperature is high, so that K>>T. Accordingly, the test time of the 16-bit DRAMs is about 4 times longer than that of the 4-bit DRAMs. In other words, the time required for the operation test increases with decreasing number of chips testable simultaneously.

In order to reduce the time required to implement the operation test of the multi-bit DRAMs, it may be possible to divide the memory cell array corresponding to a single bit into two or more arrays, in the same way as with the case of the above-mentioned 4-bit DRAM 70 shown in FIG. 1.

In the case of the multi-bit DRAMs, however, it is practically impossible to divide the memory cell array of a single block into two or more, because the chip size inevitably increases and therefore the cost thereof also increases.

In addition, since the K>>T as described above, even if the time t required for single test signal writing and reading operation is reduced, it is impossible to sufficiently reduce the total time required for the operation test.

Further, without being limited to only DRAMs, other semiconductor memory devices involve the same problem as described above.

SUMMARY OF THE INVENTION

With these problems in mind, therefore, it is the object of the present invention to provide a semiconductor memory device whose operation test can be implemented in a short time, irrespective of the number of bits.

According to the present invention, there is provided a semiconductor integrated circuit, comprising:
a plurality of memory cell arrays;
input and output sections each provided so as to correspond to each of said memory cell arrays; and
allocating means provided between said memory cell arrays and said input and output sections, for allocating one of said memory cell arrays to one of said input output sections in ordinary mode and a plurality of said memory cell arrays to a part of said input and output sections in test mode.

In the semiconductor memory device according to the present invention, in the ordinary mode, a single memory cell array is allocated to a single input and output section. In the information signal writing and reading operation, the information signals are written or read between each memory cell array and an input and output section corresponding to each memory cell array, in the operation test, however, the test signals are written or read between a single input and output section and a plurality of memory cell arrays.

In other words, since only a part of the input and output sections are used for the operation test, it is possible to decrease the number of I/O pins allocated to the chip, so that the number of chips whose operation tests can be implemented simultaneously can be increased, thus reducing the time required for the operation test of the memory device as a whole.

DETAILED DESCRIPTION OF THE PREFERRED EMBODIMENTS

A first embodiment of the memory device according to the present invention will be described hereinbelow with reference to the attached drawings. As an example of the first embodiment, an 8-bit DRAM so configured that only 4-bits are used in the operation test will be explained.

Figure 5:
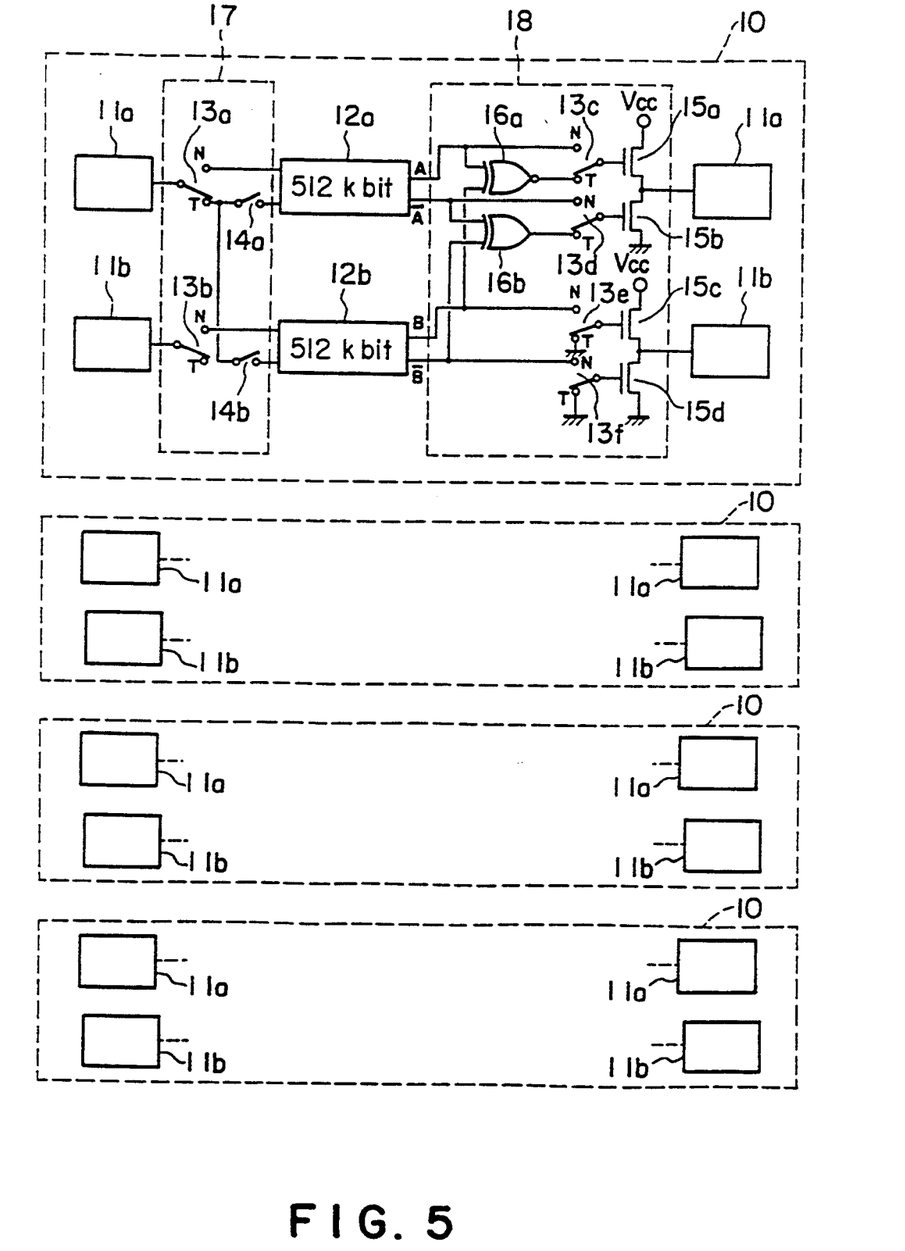
FIG. 5 is a schematic block diagram showing a first embodiment of the semiconductor memory device according to the present invention.

FIG. 5 is a block diagram showing the configuration of the DRAM related to the first embodiment. In FIG. 5, two input and output sections 11a and 11b and two memory cell arrays 12a and 12b are allocated to each of four blocks 10, respectively. Therefore, the chip has 8 input and output sections and 8 memory cell arrays in total. Further, in FIG. 5, two input and output sections 11a and 11b are shown at two different positions for better understanding.

Each of the memory cell arrays 12a and 12b can store information signals of 512 kbits. Therefore, each block 10 has a memory capacity of 1M bits, and the device has a memory capacity of 4M bits in total. Further, each block 10 includes a write circuit 17 and a read circuit 18, respectively.

The write circuit 17 includes change-over switches 13a and 13b for switching Normal mode (N in FIG. 5) to Test mode (T in FIG. 5) or vice versa, and test switches 14a and 14b for switching a turn-on status to a turn-off status or vice versa of input signals when the test mode is selected.

The read circuit 18 includes a logic circuit 16a for inputting an output A of the memory cell array 12a and the output B of the memory cell array 12b and outputting an inversion value of the exclusive OR of the two outputs A and B, and a logic circuit 16b for inputting an output /A of the memory cell array 12a and the output /B of the memory cell array 12b and outputting a non-inversion value of the exclusive OR of the two outputs /A and /B. Further, the drain of a MOS transistor 15a is connected to a supply voltage Vcc, and the source of a MOS transistor 15b is connected to the ground, respectively. Further, the source of the MOS transistor 15a is connected to the drain of the MOS transistor 15b so as to construct an output buffer. In the same way, two MOS transistors 15c and 15d are connected so as to construct an output buffer. In the normal mode, the gates of the MOS transistors 15a to 15d are connected to the outputs A, /A, B and /B of the memory cell arrays 12a and 12b through the switches 13c to 13f, respectively. Further, in the test mode, the gates of the MOS transistors 15a and 15b are connected to the logic circuits 16a and 16b, respectively but the gates of the MOS transistors 15c and 15d are connected to the ground.

In the semiconductor memory device as described above, to write ordinary information signals, first the change-over switches 13a and 13b of the write circuit 17 are both set to the Normal mode (N). At this time, the test switches 14a and 14b are set to the turn-off status. Therefore, information signals inputted through the input and output section 11a are written in the memory cell array 12a, and information signals inputted through the input and output section 11b are written in the memory cell array 12b, respectively. Accordingly, the information signals inputted through the 8 input and output sections can be written in parallel to each other in the corresponding memory cells of the 8 memory cell arrays.

Further, to read the ordinary information signals, the change-over switches 13c to 13f of the read circuit 18 are set to the Normal mode to read the information signals from the corresponding memory cells of the memory cell arrays 12a and 12b, respectively. In this case, when the information signal read from the memory cell array 12a is at "1", for instance, since the output A is at the H level and the output /A is at the L level, the MOS transistor 15a is turned on and the MOS transistor 15b is turned off. Therefore, a signal of Vcc volt (i.e., H level) is outputted from the input and output section 11a. On the other hand, when the information signal read from the memory cell array 12a is at "0", a signal of zero volt (i.e., L level) is outputted from the input and output section 11a. In the same way, the outputs of the memory cell array 12b are outputted from the input and output section 11b. As described above, when the information signals are read, the information signals read from the 8 memory cell arrays can be outputted in parallel to each other through the 8 input and output sections, respectively.

On the other hand, in the operation test mode of the semiconductor memory device as described above, first the change-over switches 13a to 13f are set to the Test mode. Further, at this time, the test switches 14a and 14b are set to the turn-on status. Accordingly, the single input and output section 11a is connected to the two memory cell arrays 12a and 12b, respectively, and the input and output section 11b is not connected to the memory cell arrays 12a and 12b. Further, the gates of the MOS transistors 15a and 15b are connected to the outputs of the logic circuits 16a and 16b, respectively; and on the other hand, the gates of the MOS transistors 15c and 15d are grounded through the switches 13e and 13f. That is, in the operation test mode, only the input and output section 11a is used and the input and output section 11b is not used. Accordingly, only 4 input and output sections of the 8 input and output sections in total are used without use of the remaining four input and output sections.

Thereafter, test signals for 512 bits are inputted in sequence through the input and output section 11a, so that the same test signals are written in the memory cell arrays 12a and 12b, respectively and simultaneously.

After all the test signals for 512 kbits have been written, these written test signals are read in sequence. In this case, the test signals written simultaneously in the respective memory cells of the memory cell arrays 12a and 12b are read simultaneously. Therefore, when the semiconductor memory device is operative normally, the output signals A of the memory cell array 12a are always equal in level to the output signals B of the memory cell array 12b. In the same way, the output signals /A of the memory cell array 12a are always equal in level to the output signals /B of the memory cell array 12b.

Here, since the logic circuit 16a outputs an inversion value of the exclusive OR, if A=B, the H level signal is inputted to the gate of the MOS transistor 15a to turn on the MOS transistor 15a. Further, since the logic circuit 16b outputs a value of the exclusive OR, if /A=/B, the L level signal is inputted to the gate of the MOS transistor 15b to turn off the MOS transistor 15b.

Therefore, as far as the DRAM is operative normally, signals of Vcc (i.g., H level) are outputted from the input and output section 11a with respect to all the read test signals.

On the other hand, in case the DRAM is not operative normally; that is, when the writing and reading operation is not executed normally in the memory cell arrays 12a and 12b, there exists no substantial possibility that A=B (i.e., /A=/B) can be established with respect to all the test signals of 512 kbits read from the memory cell arrays 12a and 12b, respectively. Accordingly, in case any L level signals are outputted from the input and output section 11a, it is possible to discriminate the device as being defective.

As described above, in the case of the 8-bit DRAM, since only 4 bits are used in the operation test mode, it is possible to increase the number of chips testable simultaneously, as compared with the conventional memory devices.

Figure 6:
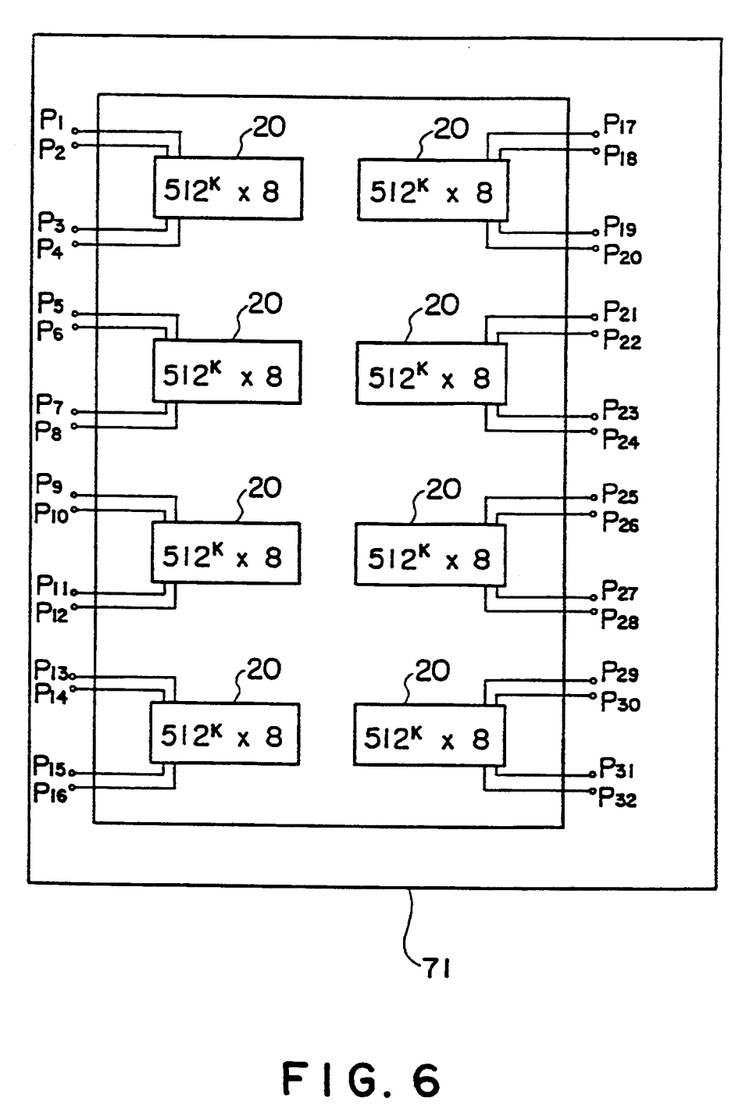
FIG. 6 is a conceptual diagram showing the status where the invention semiconductor memory devices shown in FIG. 5 are set to a test system.

In the same way as in FIG. 4, when the test system 71 whose number of the drivers and the comparators is 40 and whose maximum number of the simultaneous measurement is 8 is used, it is possible to set the 8 DRAMs (i.e., the number the same as the maximum number of the simultaneous measurement) simultaneously in this first embodiment, as shown in FIG. 6. Therefore, the time T(8)' required for the operation test of 100 chips is can be expressed as $$T(8)' = (100/8)\{k + (512 \times 1024 \cdot t)\}$$
$$= 12.5(k + 2^{19} t)$$

Accordingly, $$T(8) = (K+T)$$

This test time is the same as that required for the prior art 4-bit DRAM 70.

As described above, in the 8-bit DRAM according to the first embodiment, it is possible to reduce the test time required for the operation test.

A second embodiment of the semiconductor memory device according to the present invention will be described hereinbelow with reference to the attached drawings.

As an example of the second embodiment, an 8-bit DRAM so configured that only 2-bits are used in the operation test will be explained hereinbelow.

Figure 7:
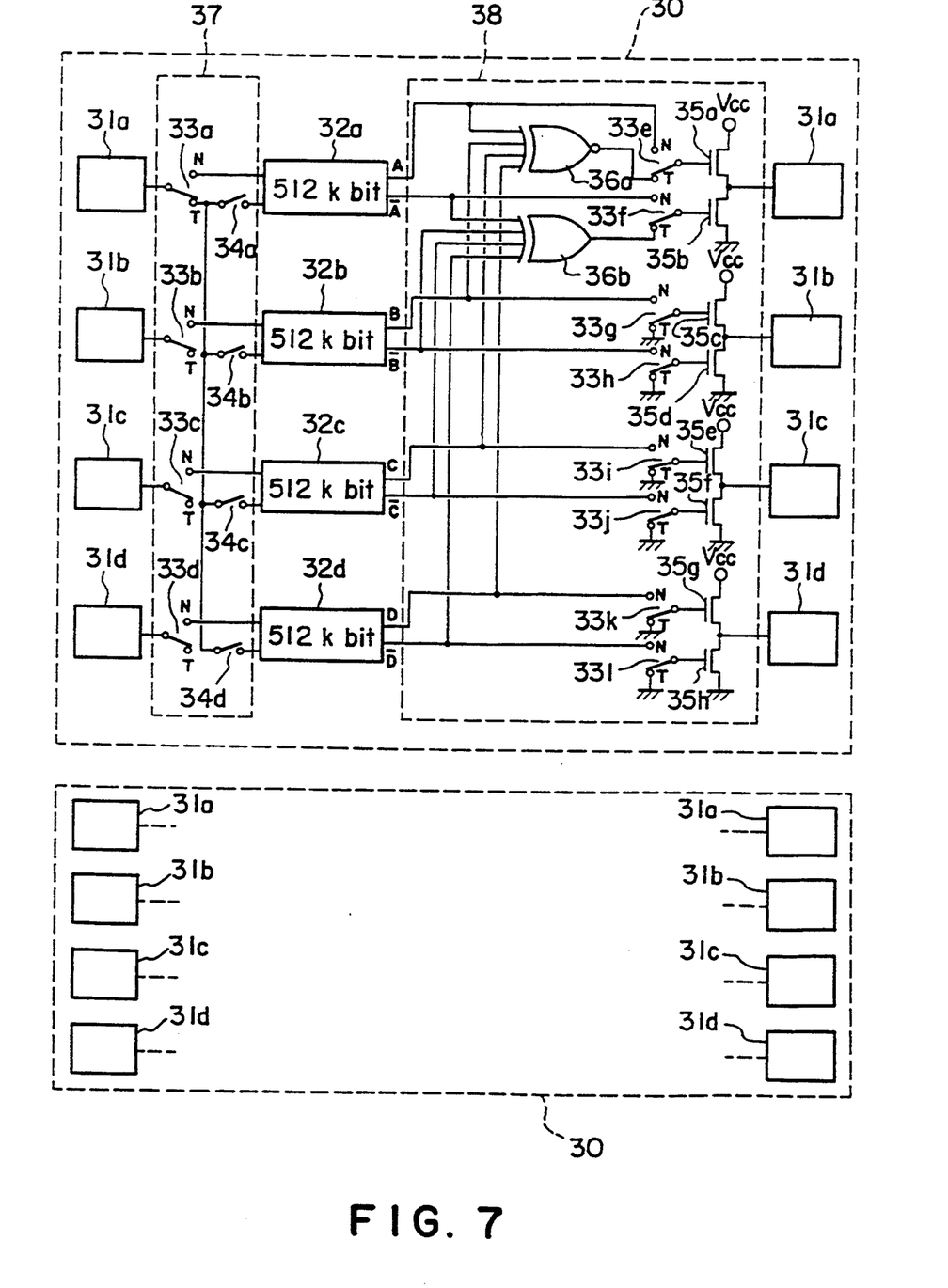
FIG. 7 is a schematic block diagram showing a second embodiment of the semiconductor memory device according to the present invention.

FIG. 7 is a block diagram showing the configuration of the DRAM related to the second embodiment. In FIG. 7, four input and output sections 31a to 31d and four memory cell arrays 32a to 32d are allocated to each of two blocks 30, respectively. Therefore, the chip has 8 input and output sections and 8 memory cell arrays in total. Further, in FIG. 7, the input and output sections 31a to 31d are shown at two different positions for better understanding.

Each of the memory cell arrays 32a to 32d can store information signals of 512 kbits in the same way as in the first embodiment. Therefore, the device has a memory capacity of 4M bits in total. Further, each block 30 includes a write circuit 37 and a read circuit 38, respectively.

The write circuit 37 includes change-over switches 33a to 33d for switching the Normal mode (N in FIG. 7) to the Test mode (T in FIG. 7) or vice versa, and test switches 34a to 34d for switching a turn-on status to a turn-off status or vice versa of input signals when the test mode is selected.

The read circuit 38 includes a logic circuit 36a for inputting four outputs A, B, C and D of the memory cell arrays 32a to 32d and outputting an inversion value of the exclusive OR of the four outputs A to D, and a logic circuit 36b for inputting four outputs /A, /B, /C and /D of the four memory cell arrays 32a to 32d and outputting a non-inversion value of the exclusive OR of the four outputs /A to /D. Further, the drain of a MOS transistor 35a is connected to a supply voltage Vcc, and the source of a MOS transistor 35b is connected to the ground, respectively. Further, the source of the MOS transistor 35a is connected to the drain of the MOS transistor 35b so as to construct an output buffer. In the same way, two MOS transistors 35c and 35d; 35e and 35f; and 35g and 35h are connected so as to construct an output buffer, respectively. In the normal mode, the gates of the MOS transistors 35a to 35h are connected to the outputs A, /A, B, B, C, /C, D and /D of the memory cell arrays 32a to 32d through the change-over switches 33e to 33l, respectively. Further, in the test mode, the gates of the MOS transistors 35a and 35b are connected to the logic circuits 36a and 36b, respectively but the gates of the other MOS transistors 35c to 35h are connected to the ground.

In the semiconductor memory device as described above, to write ordinary information signals, first the change-over switches 33a to 33d of the write circuit 37 are all set to the Normal mode (N) in the same way as in the first embodiment. In addition, the test switches 34a to 34d are set to the turn-off status. Accordingly, the information signals inputted through the 8 input and output sections can be written in parallel to each other in the corresponding memory cells of the 8 memory cell arrays.

Further, to read the ordinary information signals, the change-over switches 33e to 33l of the read circuit 38 are set to the Normal mode (N in FIG. 7) to read the information signals from the corresponding memory cells of the memory cell arrays 32a to 32d, respectively in the same way as in the first embodiment. In this case, since the MOS transistors 35a to 35h in the read circuit 38 are turned on or off according to the values of the read information signals, the input and output sections 31a to 31d outputs a signal of Vcc or zero volt. As described above, when the information signals are read, the information signals read from the 8 memory cell arrays can be outputted in parallel to each other through the 8 input and output sections, respectively.

The circuit operation of the second embodiment is roughly the same as with the case of the first embodiment.

In the operation test mode of the semiconductor memory device as described above, first the change-over switches 33a to 33l are set to the Test mode (T in FIG. 7). Further, at this time, the test switches 34a to 34d are set to the turn-on status. Accordingly, only the input and output section 31a is used and the other input and output sections 31b to 31d are not used. Accordingly, only 2 input and output sections of the 8 input and output sections in total are used without use of the remaining 6 input and output sections.

Thereafter, in the same way as in the first embodiment, test signals for 512 kbits are inputted in sequence through the input and output section 31a, and further these written test signals are read in sequence through the logic circuits 36a and 36b and the MOS transistors 35a and 35b. In this case, only when the semiconductor device is operative normally, a signal of substantially Vcc volt is outputted. When not operative normally, a signal of zero volt is outputted.

As described above, in the case of the 8-bit DRAM of this embodiment, since only 2 bits are used in the operation test mode, it is possible to increase the number of chips testable simultaneously, as compared with the conventional memory devices.

Figure 8:
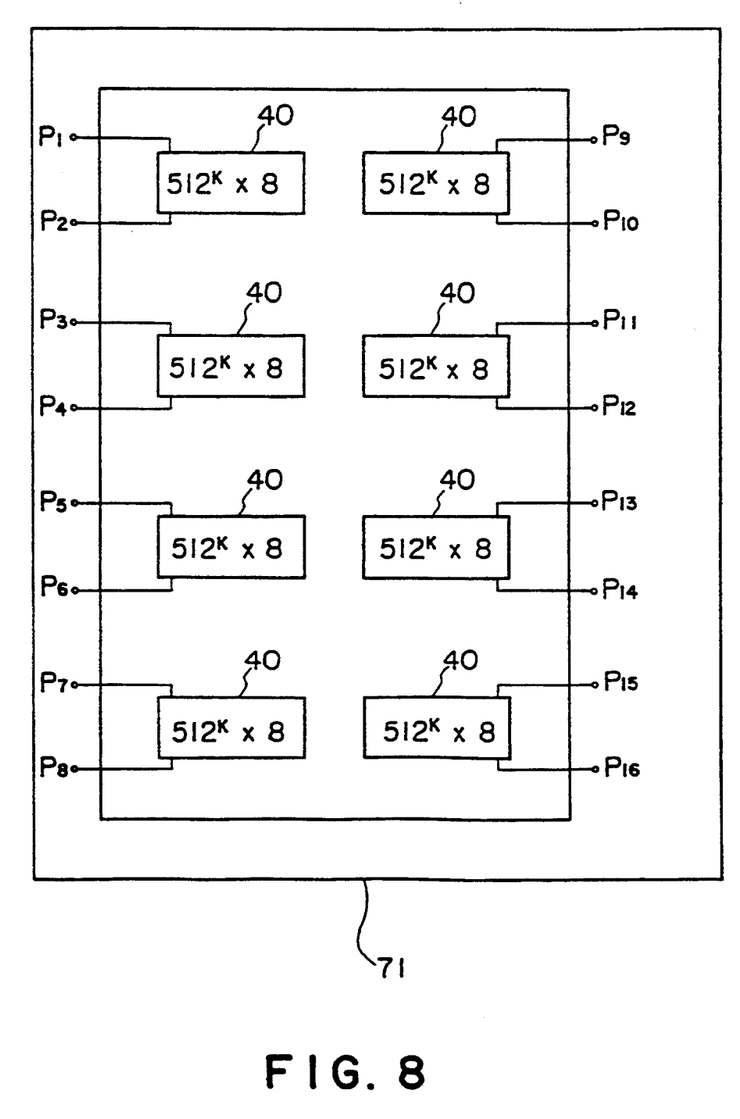
FIG. 8 is a conceptual diagram showing the status where the invention semiconductor memory devices shown in FIG. 7 are set to a test system.

In the same way as in FIG. 4, when the test system 71 whose number of the drivers and the comparators is 40 and whose maximum number of the simultaneous measurement is 8 is used, it is possible to set the 8 DRAMs (i.e., the number the same as the maximum number of the simultaneous measurement) simultaneously in this second embodiment, as shown in FIG. 8. Therefore, the time T(8)" required for the operation test of 100 chips can be expressed as $$T(8)'' = (100/8)\{k + (512 \times 1024 \cdot t)\}$$
$$= 12.5(k + 2^{19} t)$$

Accordingly, $$T''(8) = (K+T)$$

This test time is the same as that required for the prior art 4-bit DRAM 70 and the 8-bit DRAM 20 of the first embodiment.

As described above, even in the 8-bit DRAM according to the second embodiment, it is possible to reduce the test time required for the operation test.

Further, in the above-mentioned first and second embodiments, although the number of bits used in the operation test mode is determined to be 4 or 2, it is of course possible to determine any other values as the number of usable bits. For instance, it is possible to construct the device in such a way that only one bit is used in the operation test mode.

Further, in the above-mentioned embodiments, although the 8-bit DRAM is described by way of example, the same effect can be obtained on other 16-bit or 18-bit DRAMs in the same way. Further, the present invention can be applied to various semiconductor memory devices other than the DRAMs in the same way as above.

As described above, according to the present invention, it is possible to provide the semiconductor memory device whose operation test can be implemented in a short time, irrespective of the number of bits.

What is claimed is:

1. A semiconductor memory device, comprising:
   N2-unit memory cell blocks each having N1-unit memory cell arrays, where N1 and N2 denote integers greater than one;
   (N1×N2)-unit input and output sections, arranged so as to correspond to each of said memory cell arrays, for inputting and outputting signals to and from said memory cell array;
   a write circuit disposed for each memory block, for inputting information signals to be written in each memory cell array through said corresponding input and output sections in a normal mode, and for writing test signals inputted through N3-unit input and output sections to N1/N3-unit memory cell arrays, respectively in each of said memory cell blocks in a test mode, where N3 is an integer less than N1; and
   a read circuit disposed for each memory block, for outputting information signals read from said N1-unit memory cell arrays, respectively through said corresponding input and output sections in the normal mode, and outputting a discriminating result indicative of whether signals read from said N1/N3-unit memory cell arrays in which the same test signals have been written match each other, through said N3-unit input and output sections, the same as used when the test signals have been written, in said test mode.

2. The semiconductor memory device of claim 1, wherein said write circuit of each of said memory cell blocks comprises N1-unit first switches each connected between said input and output section and said corresponding memory cell array, for switching the normal mode to the test mode or vice versa; and N1-unit second switches each connected to a test mode side of each of N3-unit of said N1-unit first switches, for selecting said memory cell array to be tested.

3. The semiconductor memory device of claim 1, wherein a memory bit width is N1×N2.

4. The semiconductor memory device of claim 1, wherein said read circuit comprises a first comparison means for deriving a first coincidence signal when non inverted output signals of said memory cells coincide, a second comparison means for deriving a second coincidence signal when inverted output signals of said memory cells coincide and output signal forming means for forming a comparison result to supply to said N3-unit input and output sections in said test mode and for forming output signals of said memory cell arrays to corresponding said input and output sections in said normal mode.

5. The semiconductor memory device of claim 4, wherein said output signal forming means comprises N1-unit gate means, each of said gate means being comprised of a first transistor for charging and a second transistor for discharging,
   said gate means being supplied with a pair of inverted and non-inverted output signals from said respective memory arrays in said normal mode, and
   N1/N3-unit gate means being supplied with said first and second comparison signals in said test mode.

6. The semiconductor memory device of claim 5, wherein each of said N1/N3 gate means has a pair of third switches for selectively supplying said first and second comparison signals to said first transistor and said second transistor of said gate means, respectively, in said test mode.

7. The semiconductor memory device of claim 6, wherein each of (N1/N3−1) gate means has a pair of fourth switches which transmit a pair of non-inverted and inverted signals to (N1/N3−1) input and output sections in normal mode and inhibit the signals from being transmitted in said test mode.

* * * * *